(12) United States Patent
Hori

(10) Patent No.: US 7,038,992 B1
(45) Date of Patent: May 2, 2006

(54) MASK PATTERN FORMING METHOD AND DEVICE, AND METHOD OF PRODUCING OPTICAL DISK

(75) Inventor: Kazuhito Hori, Kanagawa (JP)

(73) Assignee: Sony Corporation (JP)

( * ) Notice: Subject to any disclaimer, the term of this patent is extended or adjusted under 35 U.S.C. 154(b) by 1315 days.

(21) Appl. No.: 09/652,145

(22) Filed: Aug. 31, 2000

(30) Foreign Application Priority Data

Sep. 2, 1999 (JP) .................................... P11-249308

(51) Int. Cl.
*G11B 1/00* (2006.01)

(52) U.S. Cl. ..................................... 369/59.25; 369/285
(58) Field of Classification Search .............. 369/53.11, 369/53.16, 53.2, 53.21, 59.11, 59.23, 59.25, 369/284, 285
See application file for complete search history.

(56) References Cited

U.S. PATENT DOCUMENTS

| | | | | |
|---|---|---|---|---|
| 4,509,162 A | * | 4/1985 | Rester ..................... | 369/275.1 |
| 5,238,786 A | * | 8/1993 | Kashiwagi ................. | 430/321 |
| 5,881,038 A | * | 3/1999 | Oshima et al. .......... | 369/47.12 |
| 6,252,845 B1 | * | 6/2001 | Hino et al. ............... | 369/275.3 |
| 6,606,294 B1 | * | 8/2003 | Takemura et al. ........ | 369/275.3 |
| 6,721,254 B1 | * | 4/2004 | Yamaguchi ............... | 369/53.35 |
| 6,721,264 B1 | * | 4/2004 | Kutaragi et al. ......... | 369/275.2 |

* cited by examiner

*Primary Examiner*—Thang V. Tran
*Assistant Examiner*—Bach Vuong
(74) *Attorney, Agent, or Firm*—Rader, Fishman & Grauer PLLC; Ronald P. Kananen

(57) ABSTRACT

A method of forming a mask pattern includes a formatting step for formatting authoring data in accordance with formats of specified media either by a fixed amount at a time or continuously. The authoring data is obtained by an authoring operation in which base information, such as image information or audio information, is edited. The method of forming a mask pattern also includes a mask pattern generating step in which basic pattern information is generated from basic signal pattern data necessary for various types of optical disks as a result of carrying out a pattern editing operation, and the basic pattern information is used to generate a mask pattern by carrying out a mask pattern generating operation. In the steps of a conventional method, it is necessary to carefully determine the conditions which allow disks produced after a plurality of later operations of the method have been carried out to satisfy standards. In addition, it is necessary to carefully observe at all times that these conditions are maintained during the long time required to produce the disks.

20 Claims, 6 Drawing Sheets

MASK PATTERN FORMING METHOD AND DEVICE, AND METHOD OF PRODUCING OPTICAL DISK

BACKGROUND OF THE INVENTION

1. Field of the Invention

The present invention relates to a method of and device for forming a mask pattern used to form a master mask used in a projection/exposure step carried out to form a metal master serving as a master disk of an optical disk, and a method of producing an optical disk using the metal master formed in accordance with the mask pattern obtained using the method of and device for forming a mask pattern.

2. Description of the Related Art

A general description of the method of producing a master disk of an optical disk is given. The master disk of the optical disk is a metal master or a stamper, a die needed to form the optical disk, and a circular metallic plate which is approximately 0.3 mm thick and has a slightly convex surface for forming, for example, pits therein.

Hereunder, a common method of producing a master disk of an optical disk is described with reference to FIG. 8.

A glass plate is cleaned with a cleaning device, and polished by carrying out a glass plate cleaning/polishing operation 91. Then, a coupling agent which increases the intimacy with which a resist comes into contact with the glass plate is applied by carrying out a coupling agent applying operation 92, after which a photoresist is applied to the glass plate to a certain film thickness using a resist coater by carrying out a photoresist applying operation 93, whereby a resist disk 110 is formed. The resist disk 110 is baked at a certain temperature by carrying out a baking operation 94.

The resist disk 110 that has been baked is set on a precision rotary table 111 of a cutting machine shown in FIG. 9 in order to perform a laser cutting operation 95 thereon. The precision rotary table 111 is rotated by a motor 112 subjected to a rotary servo operation. Then, the resist disk 110 is irradiated with and exposed to a laser beam from thereabove by a linear head 113 constructed so as to be precisely linearly driven on a normal line of the precision rotary table 111, whereby a signal is recorded on the resist disk 110. The linear head 113 comprises a light modulator 114, an optical system lens 115, a beam splitter 116, and an objective lens 117. In the linear head 113, an optical slider 118 is driven as a result of being slid by a radial advancing system motor 119. Authoring data produced by an authoring operation 96 and a signal produced by encoding a subcoding signal by a formatting operation 97, both of which operations 96 and 97 are shown in FIG. 8, are supplied to the light modulator 114 through a signal generator 120. Through the optical system lens 115, the beam splitter 116, and the objective lens 117, the resist disk 110 on the precision rotary table 111 is irradiated with a laser beam emitted from a recording laser 122 and modulated by the light modulator 114 in accordance with the encoded signal. The focusing operation of the objective lens 117 is controlled by a driving coil in accordance with a focus error signal detected by a light detector 121. The radial advancing system motor 119 is subjected to a linear advancing servo operation, while the recording laser 122 is subjected to an exposure power control servo operation.

When the laser cutting operation 95 is completed, a developing device is used to perform a developing operation 98 on the resist disk 110 in order to remove any resist in the pits and grooves, whereby the master disk of the optical disk is produced. When the master disk is produced, a nickel (Ni) electrode with a size not more than 100 nm is formed by an operation 99 carried out to make the master disk electrically conductive. After performing the operation 99, Ni is applied to the Ni electrode to a thickness of approximately 300 (m by a thin-film processor by carrying out an electrotyping operation 100. After performing the electrotyping operation 100, the Ni metallic plate is peeled off from the glass plate, and any photoresist that is stuck is removed in order to adjust the inside and outside diameters thereof, whereby a stamper called a metal master 101 is produced. The precision of the signal of the metal master 101 and the like are evaluated by a signal evaluating operation 102.

However, in the above-described operations, particularly in the laser cutting operation, it is necessary to carefully determine the conditions which allow disks produced after a plurality of later operations of the method have been carried out to satisfy standards. In addition, it is necessary to carefully observe at all times that these conditions are maintained during the long time required to produce the disks.

Pits in different types of media have different pit shapes and sizes, so that the operation conditions need to be separately determined according to the types of media. For example, pits in a compact disk (CD) and a digital video disk (DVD) have forms and sizes given in Table 1.

TABLE 1

|  | CD | DVD |
| --- | --- | --- |
| Pit length | 0.9 to 3.3 µm | 0.4 to 1.87 µm |
| Pit width | 0.5 to 0.8 µm | 0.4 µm or less |
| Track pitch | 1.6 µm | 0.74 µm |
| Capacity | 780 MB | 4.7 GB |

In general, the pit length of a CD is from 0.9 to 3.3 µm, whereas the pit length of a DVD is from 0.4 to 1.87 µm. The pit width of a CD is from 0.5 to 0.8 µm, whereas the pit width of a DVD is equal to or less than 0.4 µm. The track pitch of a CD is 1.6 µm, whereas the track pitch of a DVD is 0.74 µm. The capacity of a CD is 780 MB, whereas the capacity of a DVD is 4.7 GB.

The laser cutting operation using the cutting machine illustrated in FIG. 9 chiefly and ultimately determines the precision of the optical disk, so that driving systems (such as the advancing systems and the rotary system) need to be constructed with ultrahigh precision, an optical system which minimizes the diameter of a laser spot needs to be constructed, and a focus servo capability for controlling the size of a laser spot and a servo controlling capability for controlling the power of the laser at a fixed value in accordance with the rotational speed of the disk are required. This makes it necessary to use an expensive and high-precision machine.

When a pit recording disk, such as a compact disk-read only memory (CD-ROM) or a digital video disk-read only memory (DVD-ROM), is used, the conventional laser cutting operation takes a very long time to complete because the pits of the disk are irradiated with and exposed to laser one pit at a time. For example, when a 4.7 GB DVD is used, the laser cutting operation takes at least 100 minutes to complete. Therefore, the laser cutting operation is considered as one of the operations of the method which takes a long time to complete. During the laser cutting operation, it is necessary to carefully observe that the cutting precision is not adversely affected by eliminating, for example, external vibrations to the extent possible.

In the formatting operation, source media data subjected to an authoring operation is read from a driver, and, in synchronism with the cutting machine, encoding of the data to predetermined codes is carried out in real time. Therefore, the formatting operation also needs to be carried out reliably and precisely for a long period of time. In setting the optical system, various types of optical parts need to be adjusted very precisely every time a different type of disk is used. Therefore, when a differently formatted disk is to be cut with the same cutting machine, changes need to be made in the optical system each time a different type of formatting operation is carried out. Precise adjustments of the optical system require excellence in specialized techniques and time.

In the laser cutting operation, the resist disk exposed to laser is immediately developed by a developing device. Due to unstable process factors such as development conditions, slight changes in the focus servo operation, differences in the laser exposure amount caused by the sizes of pits, etc., a theoretical controlling operation of the laser power alone does not necessarily result in the formation of ideal pits as a result of linear speed and advancing conditions. Therefore, a large jitter value may occur, so that, for example, it may be necessary to precisely adjust the exposure power, to control the power of the laser in correspondence with the sizes of the pits, to control the rising position of the pits (control in the time axis direction), etc.

SUMMARY OF THE INVENTION

In view of the above-described problems, it is an object of the present invention to provide a method of and a device for forming a mask pattern, which allow more precise and more reliable recording operations to be carried out in a shorter time, and which provide more flexibility so that, for example, a recording operation can be carried out with corrections flexibly made in correspondence with a process condition. It is another object of the present invention to provide a method of producing an optical disk which uses the mask pattern formed in the mask pattern forming method and device, which does not require high-precision and expensive devices, and which does not require time to carry out To these ends, according to one aspect of the present invention, there is provided a method of forming a mask pattern, comprising the steps of:

carrying out a formatting operation for generating formatted data obtained by formatting authoring data; and generating a mask pattern by making the formatted data obtained from the step of carrying out a formatting operation correspond to basic pattern information obtained from basic signal pattern data necessary for a plurality of types of optical disks.

The basic pattern information may be obtained by processing the basic signal pattern data necessary for the plurality of types of optical disks using a computer.

The basic pattern information may be previously recorded in a memory, and the recorded basic pattern information may be used in the step of generating a mask pattern to generate the mask pattern.

According to another aspect of the present invention, there is provided a device for forming a mask pattern, comprising:

basic pattern generating means for generating a basic signal pattern necessary for various types of optical disks as a basic pattern; and mask pattern generating means for generating a mask pattern by making formatted data obtained by formatting authoring data correspond to the basic pattern generated by the basic pattern generating means.

The device for forming a mask pattern may be constructed so as to further comprise a memory means for recording therein the basic pattern generated by the basic pattern generating means, wherein the mask pattern generating means uses the basic pattern information recorded in the memory means in order to generate the mask pattern.

DESCRIPTION OF THE PREFERRED EMBODIMENT

Hereunder, a description of a preferred embodiment of the method of producing an optical disk in accordance with the present invention will be given with reference to the drawings. In this method, a mask pattern formed in a mask pattern forming method of the present invention is used to produce an optical disk.

Figure 1:
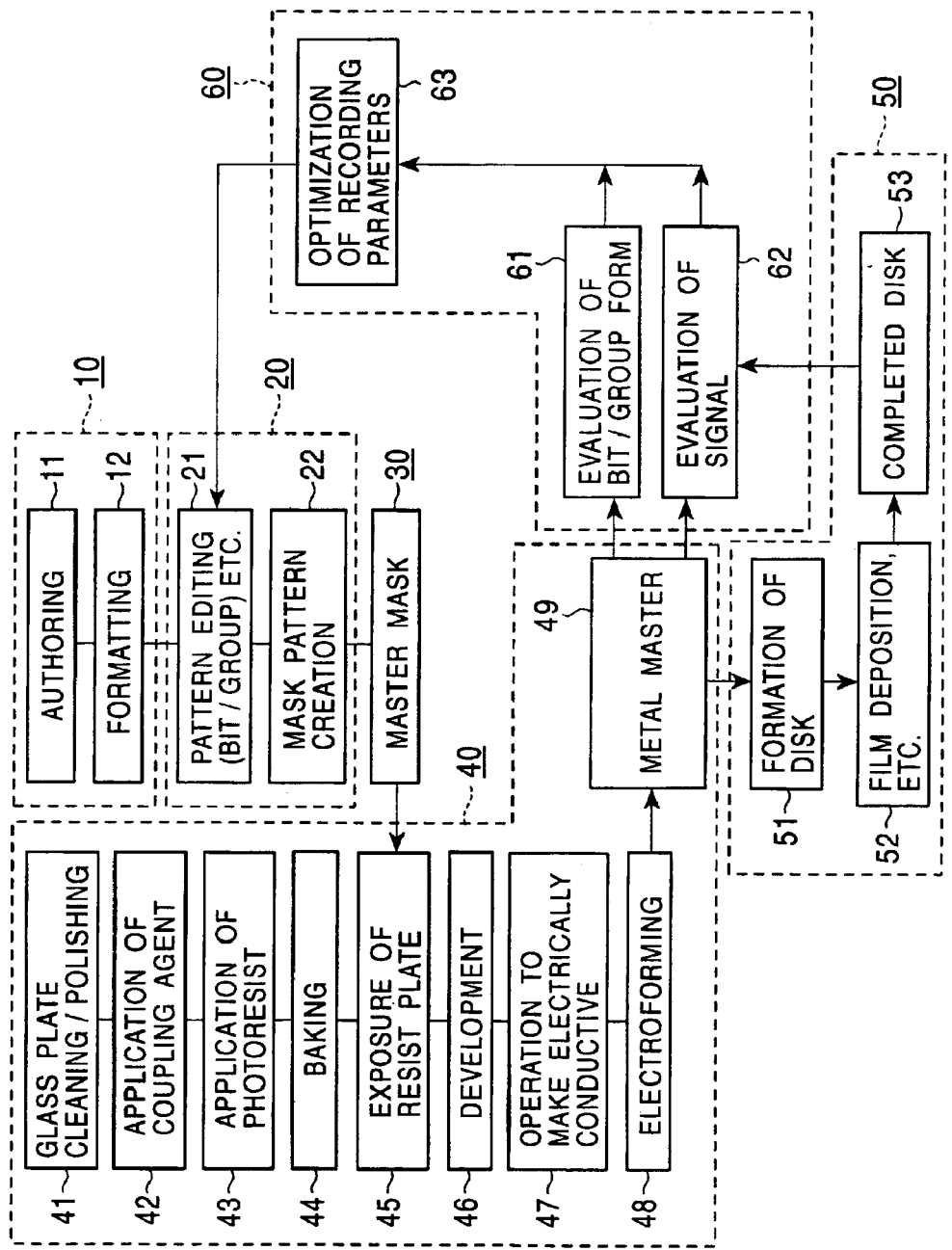
FIG. 1 illustrates the specific steps performed in a method of producing an optical disk in accordance with the present invention.

FIG. 1 illustrates the specific steps carried out in the method of producing an optical disk. In general, the method of producing an optical disk comprises a formatting step 10 for producing formatted data by formatting authoring data; a mask pattern generating step 20 for generating a mask pattern by making the formatted data obtained in the formatting step 10 correspond to basic pattern information obtained from basic signal pattern data required for various types of optical disks; a master mask forming step 30 for forming a master mask from the mask pattern generated in the mask pattern generating step 20; a metal master forming step 40 for forming a metal master using the master mask formed in the master mask forming step 30; and a completed optical disk forming step 50 for forming a completed optical disk using the metal master formed in the metal master forming step 40.

In the formatting step 10, authoring data produced by an authoring operation 11 in which base information such as image or audio base information is edited is formatted by a formatting operation 12 in accordance with formats of specified media by certain amounts at a time or continuously.

In the mask pattern generating step 20, basic pattern information is produced from basic signal pattern data necessary for various types of optical disks by a pattern editing operation 21. Then, a mask pattern generating operation 22 is carried out to generate a mask pattern using the basic pattern information.

The aforementioned basic pattern information refers to information obtained by processing the basic signal pattern data necessary for various types of optical disks using a computer. The basic pattern information is previously recorded in a memory of the computer.

Figure 2:
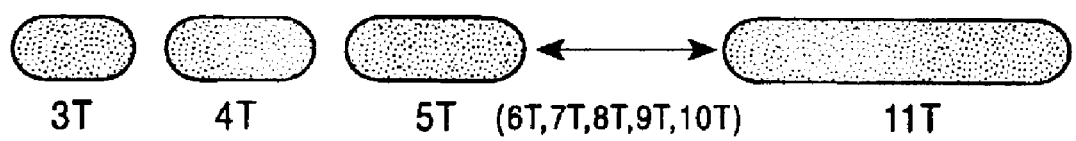
FIG. 2 illustrates a recording signal pattern of a compact disk (CD).
Figure 3:
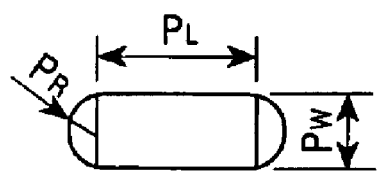
FIG. 3 shows the form parameters of a pit.

For example, when information is recorded on the optical disk in the form of pits, the aforementioned basic pattern information is parameter information of the forms of the pits in a plurality of types of pit patterns. In the case of a compact disk (CD), as shown in FIG. 2, a recording signal comprises nine types of pitches, 3T, 4T, 5T, 6T, 7T, 8T, 9T, 10T, and 11T as basic units. As shown in FIG. 3, images of various pits serving as basic units are defined using parameters, such as a pit width Pw, a pit length Pl, and a pit edge radius Pr. The parameters are recorded in a memory.

In the pattern editing operation 21, the parameter data recorded in the memory is edited in correspondence with the formatted data obtained in the formatting step 10. Then, by carrying out the mask pattern generating operation 22, a mask pattern is generated.

In the master mask forming step 30, the mask pattern generated in the mask pattern generating step 20 is output to, for example, an image drawing device in order to form a master mask. The master mask is formed by performing, for example, a laser beam or an electronic beam drawing operation on, for example, a very fine blank mask, such as a chromium (Cr) blank mask. In order to increase precision, the master mask is actually subjected to reduction exposure. Therefore, the master mask is formed while forming an image of it in enlarged form.

In the metal master forming step 40, a glass plate cleaning/polishing operation 41 is carried out so that a glass plate is cleaned using a cleaning device, and then polished. After the polishing, in order to increase the intimacy with which a resist is in contact with the glass plate, a coupling agent applying operation 42 is carried out in order to apply a coupling agent thereto. After applying the coupling agent, a photoresist applying operation 43 is carried out in order to apply a photoresist to the glass plate to a certain film thickness using a resist coater. After applying the photoresist, a baking operation 44 is carried out in order to bake a resist disk at a certain temperature. After the baking, a resist disk exposing operation 45 is carried out to expose the resist disk to light using the master mask formed in the master mask forming step 30. After a development step 46 carried out on the exposed resist disk using a developing device, any resist at the pits or grooved sections are removed in order to form a master disk of an optical disk. After forming the master disk, an operation 47 to make the master disk electrically conductive is carried out to form a nickel (Ni) electrode to a size of not more than 100 nm. After carrying out the operation 47, an electroforming operation 48 is carried out to plate the Ni electrode with nickel to a thickness of approximately 300 μm. After carrying out the electroforming operation 48, the Ni metal plate is peeled off from the glass plate, and any photoresist that is stuck is removed in order to adjust the inside and outside diameters thereof, whereby a metal master 49 is formed.

In the completed optical disk forming step 50, a disk molding operation 51 is carried out to perform injection molding of resin using the metal master 49, after which a film depositing operation 52 is carried out to deposit various types of films, whereby a completed disk 53 is formed.

This method of producing an optical disk includes a recording parameter optimizing step 60 in which the precision with which the mask pattern is produced is controlled based on the results of evaluations of the completed disk 53 in order to optimize the parameter data edited in the pattern editing operation 21. In the recording parameter optimizing step 60, the metal master 49 is evaluated by carrying out a pit/groove form evaluating operation 61 and a signal evaluating operation 62, and the completed disk 53 is evaluated by carrying out the signal evaluating operation 62.

Figure 4A:
FIGS. 4A and 4B each illustrate a recording operation with the size of a pit corrected.

A description of the technology used in the method of producing an optical disk will be described in more detail below. To facilitate understanding, a recording operation on a compact disk (CD) will be taken as an example. As shown in FIG. 2, when a CD is used, a recording signal pattern comprises lands and pits with nine types of lengths, 3T to 11T. Theoretically, when the linear speed is 1.25 m/sec, the lengths of the pits are 0.87 μm, 1.16 μm, 1.45 μm, 1.74 μm, 2.02 μm, 2.31 μm, 2.60 μm, 2.89 μm, and 3.18 μm. Though the widths of the pits depend on the optical system used, they are conventionally of the order of approximately 0.5 μm to 0.8 μm. However, in a conventional method where the pits are exposed to laser one pit at a time, even if the amount of laser used for irradiation is controlled to a constant amount, the widths of the finally formed various pits vary due to, for example, the generation of heat during irradiation using laser, causing the lengths of the pits to vary. In particular, this problem occurs in a complicated manner when the lengths of the pits are small, so that, as shown in FIG. 4A, for example, the 3T signal becomes shorter than the other types of signals when it is recorded. As a result, the variations in the lengths of the pits appear as unstable recording patterns.

Figure 4B:
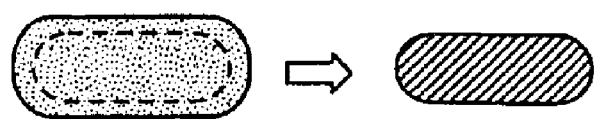

In the above-described embodiment, an ideally shaped recording pattern of the signal pits can be formed without being affected by the sizes of the pits. In FIG. 1, by carrying out the recording parameter optimizing step 60, it is possible to feed back the actual cutting operation results and determine and record the forms of the pits (the width Pw, the length Pl, and edge radius Pr) for the various types of pits. An ideal pit (see FIG. 4B) can be obtained using corresponding pit forms by forming a mask image with a large pit form which is more enhanced than an ideal value in relation to a small pit such as a 3T pit.

Figure 5A:
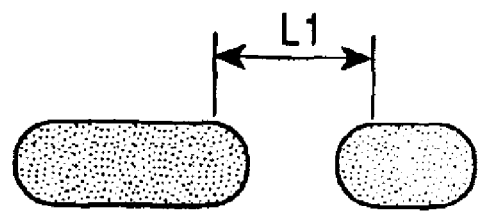
FIGS. 5A and 5B each illustrate a recording operation with a correction made in a time-axis direction of a pit.
Figure 5B:
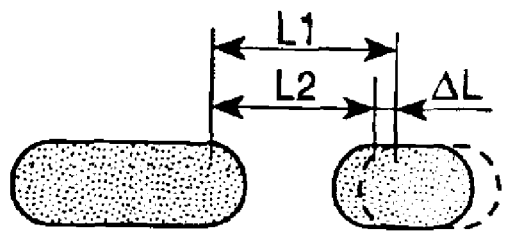

Lands can be controlled. For example, as shown in FIG. 5A, the rising characteristics of small pits can be brought closer to the ideal rising characteristics. When, for example, pursuing jitter precision, a slight variation of a pit form from an ideal value occurring during processes before and after the recording operation can be corrected by a patterning operation in which, for example, a land is made intentionally shorter by ΔL from a theoretical value L1 and the rising of the pit is shifted (see FIG. 5B). Using the same method, asymmetry and crosstalk (in the widthwise direction) can be controlled.

The aforementioned corrections are carried out by feeding back the evaluation results obtained in the recording parameter optimizing step 60. More specifically, they are carried out by feeding back the evaluation result of a signal of the completed metal master 49, the evaluation results of the forms of the pits and grooves, and the evaluation result of the disk after the molding operation. The pattern editing operation 21 is carried out to make changes in order to freely optimize individual systems by editing the basic patterns recorded in the computer.

Figure 6:
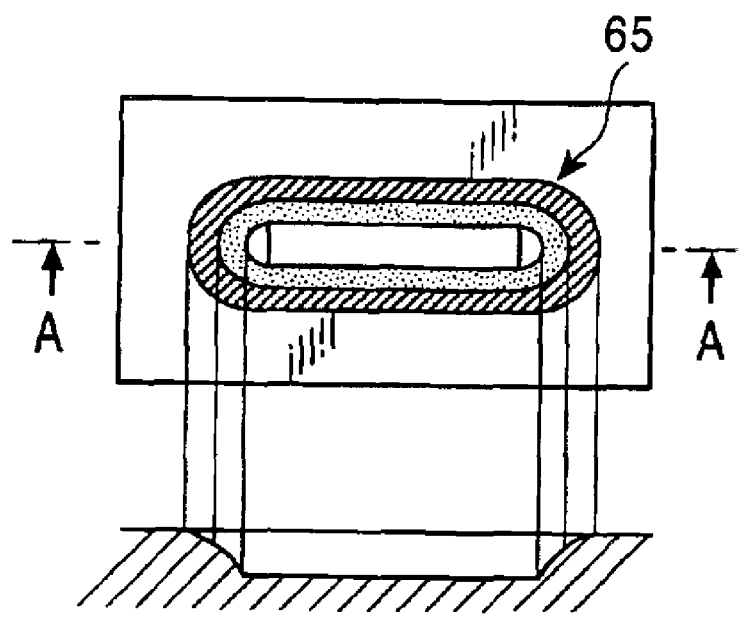
FIG. 6 illustrates a controlling operation of a slope of an edge of a pit.

The present invention which has been primarily illustrated taking as an example pit recording on a CD can be executed to perform a patterning operation on, for example, the widths of the grooves or the amount of wobbling even in a groove recording method performed on a disk in order to pursue similar advantages. In addition, a gradation-type, fine mask pattern 65 shown in FIG. 6 can be formed by forming an image of it in order to control the form of a pit in the direction of the depth thereof, such as the slope of an edge of a pit or a groove, resulting in tremendous advantages such as increased jitter precision and optimization of the molding capability.

Figure 7:
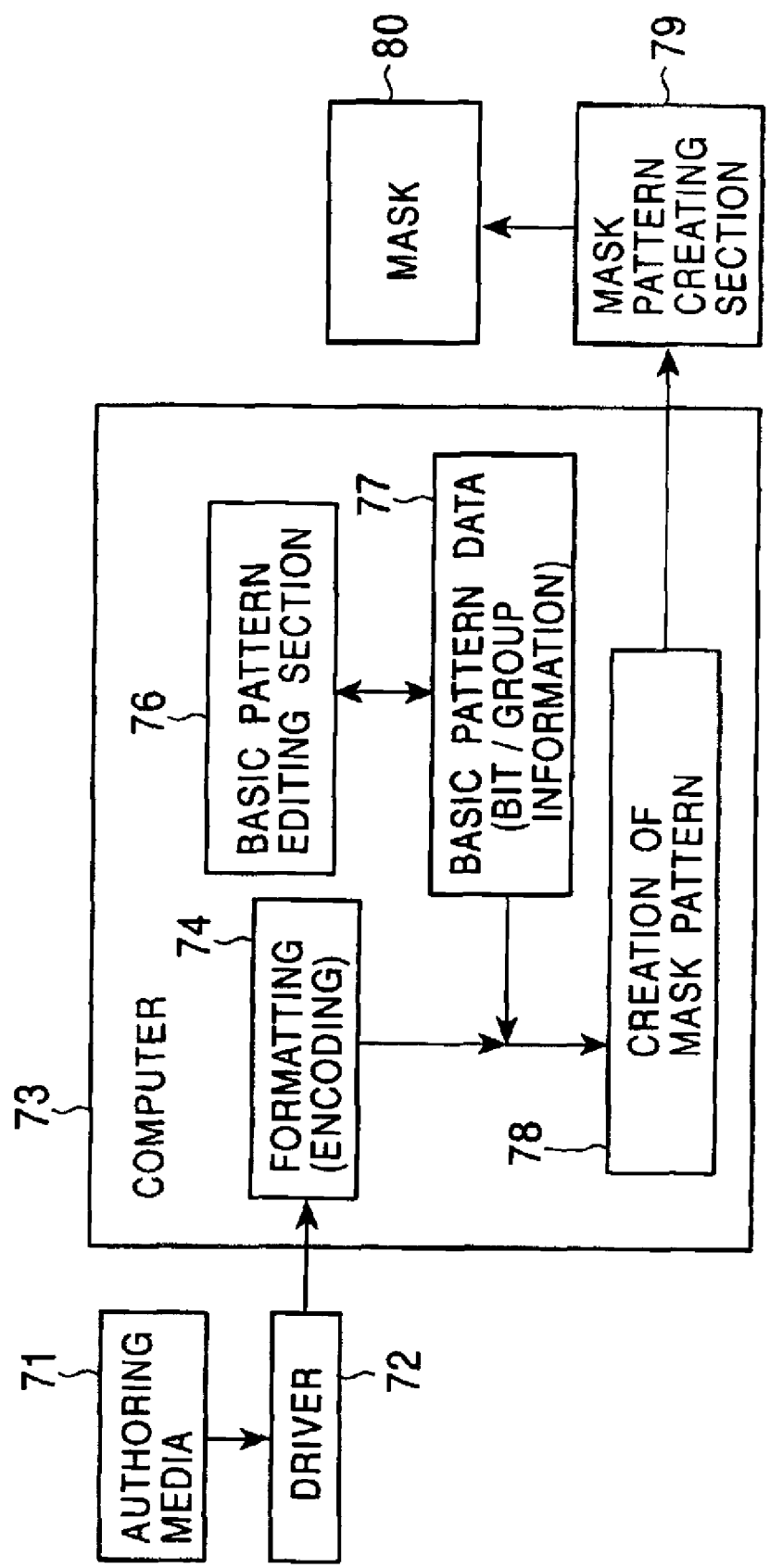
FIG. 7 is a block diagram specifically illustrating a device for forming a mask pattern.
Figure 8:
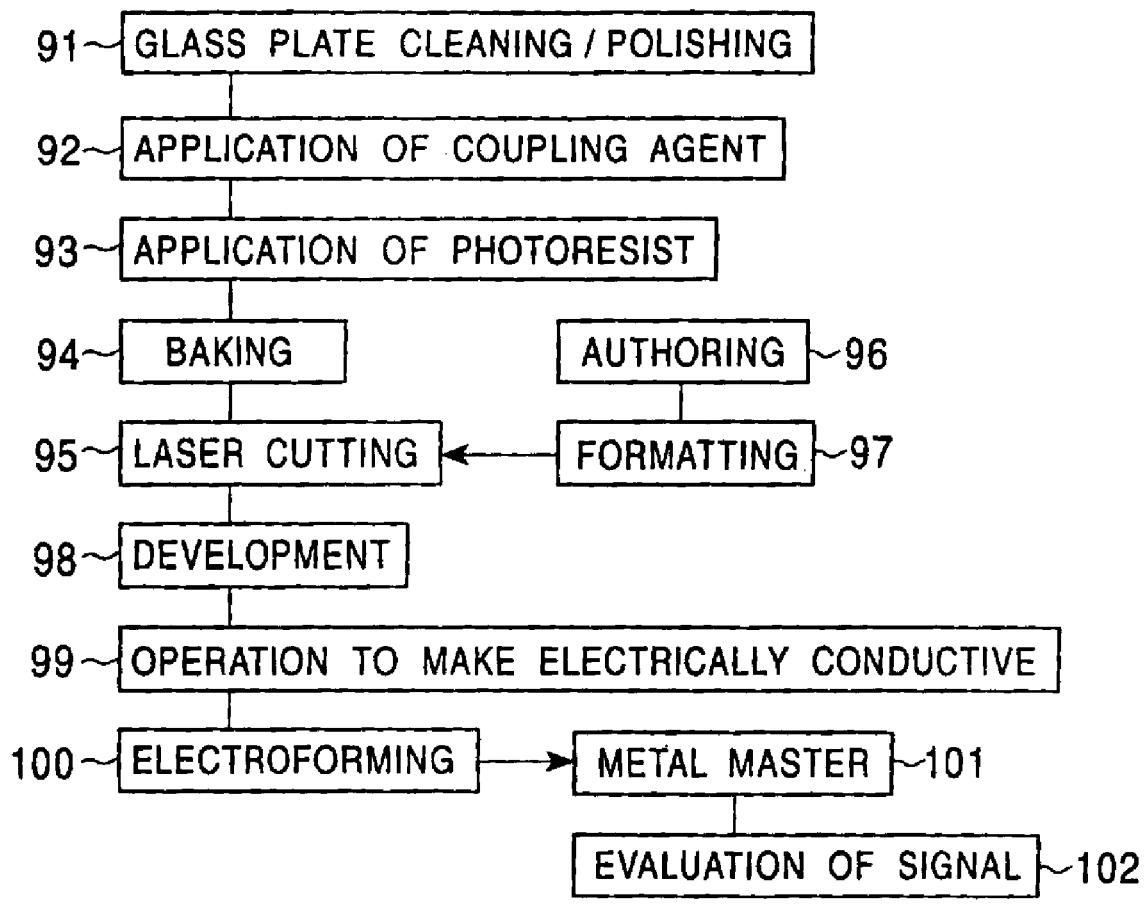
FIG. 8 illustrates the steps of a conventional method of producing a master disk of an optical disk.
Figure 9:
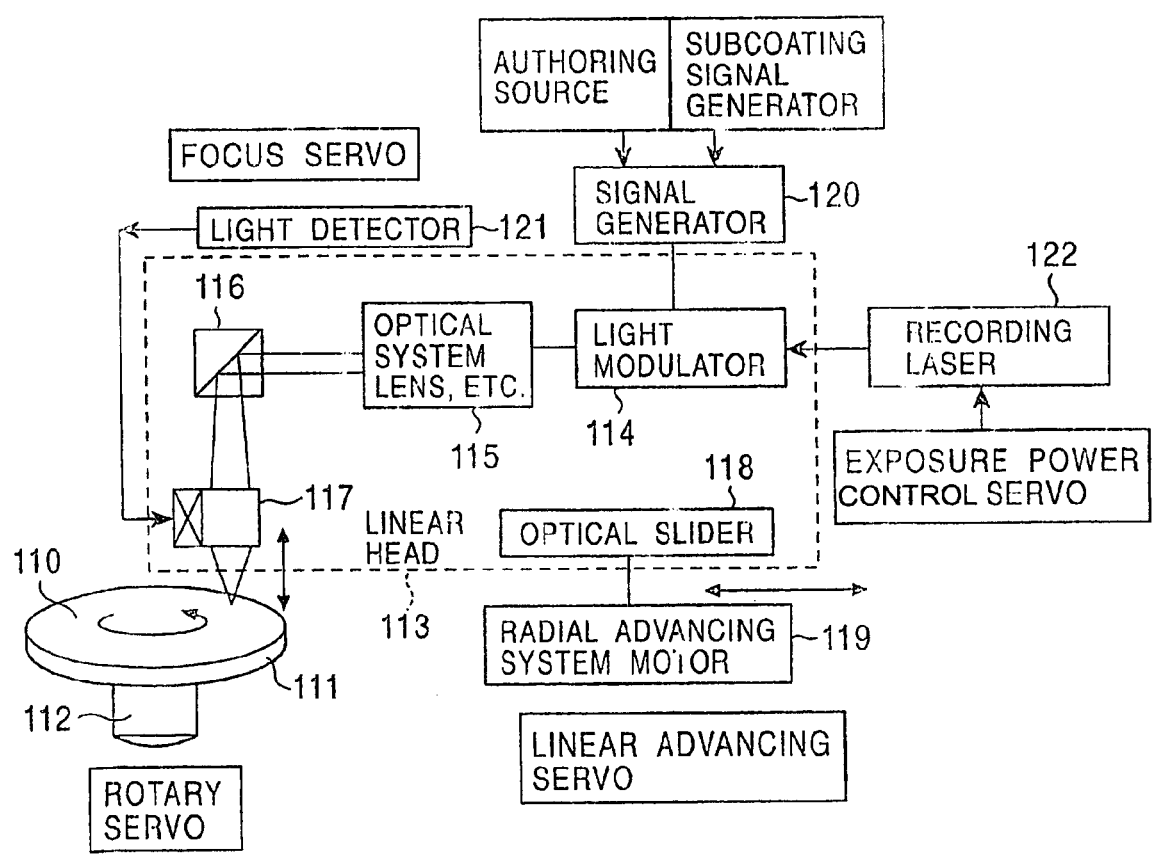
FIG. 9 is a block diagram illustrating the structure of a conventional cutting machine.

A specific example of a device for producing a mask pattern based on the mask pattern producing method of the present invention will be given with reference to FIG. 7.

The device for forming a mask pattern comprises a computer 73 and a mask pattern forming section 79. Based on the above-described mask pattern forming method, the computer 73 generates an image of a mask pattern, and the mask pattern forming section 79 produces a mask pattern based on the image of the mask pattern.

The computer 73 comprises a formatting section 74, a basic pattern editing section 76, and a mask pattern image generating section 78. The basic pattern editing section 76 comprises a basic pattern data section (memory) 77.

A medium (such as a tape or a disk) 71 which has been subjected to an authoring operation is read by a device driver (such as a special-purpose streamer or a special-purpose disk drive) 72. The read data is transmitted to the computer 73 at a high speed.

The formatting section 74 of the computer 73 formats the aforementioned read data by a certain amount at a time or continuously in correspondence with the format of the specified medium. A pattern editing section 76 generates a pattern at the computer 73 using the read data as a pit or a groove recording signal of a further required disk format. Here, more detailed forms of pits, lands, and grooves can be controlled by recording the basic patterns that are editable by changing the parameters of the forms as basic data in the memory 77. The master pattern image generating section 78 generates a mask pattern image. The mask pattern forming section 79 produces a mask pattern in accordance with the generated image. The mask pattern formed by the pattern forming section 79 is used to form a master mask 80.

According to the embodiment of the present invention, the formatting of authoring data is carried out off-line, independently of and asynchronously with the cutting machine. The pattern (of pits, grooves, etc.) can be formed all at once on the entire surface of a disk at the computer 73 during encoding without being affected by the operation of the cutting machine.

By freely and precisely controlling the forms of and separation between the pits and grooves using the computer 73, detailed recording conditions can be controlled. Therefore, by feeding back the disk evaluation results, the recording pattern is optimized during an actual process. This makes it possible to improve signal characteristics, such as jitter value, asymmetry, and crosstalk. By changing the form of a pit, such as the width of a pit, the smallest pit 3T signal, for example, can be controlled so that, for example, the signal can be partly enhanced without changing the development operation condition of the entire surface of the disk. In addition, the cutting conditions can be simply adjusted based on the conditions characteristic of the device or process conditions before and after the signal recording step, making it possible to optimize the recording operation.

Since the authoring data can be formatted off-line, independently of and asymmetrically with the cutting machine, it is not necessary to operate the formatter in synchronism with the cutting machine in real time. Therefore, the time required to produce the master mask can be considerably reduced, and a more reliable recording operation can be achieved.

Errors in the rotary and advancing systems present in a conventional cutting machine are not present in the cutting machine used in the present invention, so that the cutting operation does not depend upon mechanical precision. Therefore, the cutting operation can be carried out with high precision. In particular, jitter precision required in a high-density disk can be freely controlled in accordance with the process conditions characteristic of each of the systems.

Since the cutting machine does not require an ultrahigh-precision driving system and optical system, a simple exposing device can be used in the structure of the cutting machine. Thus, the cost of the entire machine can be reduced.

Various types of disk formatting can be easily carried out using only one device, so that switching between various types of disk formatting operations can be easily carried out in a short time without expert skill.

Since the cutting operation is carried out by one exposing operation, the recording operation can be stably performed on the entire disk surface. Similarly, since the cutting operation is carried out by one exposing operation, the exposure time can be considerably reduced, the probability with which the cutting operation is affected by, for example, external vibration is reduced, and a more reliable recording operation can be achieved.

According to the method of and device for producing a mast pattern, the recording time is reduced, a more precise and reliable recording operation is achieved, and greater flexibility is provided so that, for example, a recording operation can be carried out with corrections flexibly made in accordance with process conditions in order to produce a mask pattern.

According to the method of producing an optical disk of the present invention, an optical disk can be produced using the mask pattern formed using the mask pattern forming method and device in a short time without employing a high-precision and expensive machine.

What is claimed is:

1. A method of forming a mask pattern, comprising the steps of:

carrying out a formatting operation for generating formatted data obtained by formatting authoring data; and generating a mask pattern by making the formatted data obtained from the step of carrying out a formatting operation correspond to basic pattern information obtained from basic signal pattern data necessary for a plurality of types of optical disks.

2. A method of forming a mask pattern according to claim 1, wherein the basic pattern information is obtained by processing the basic signal pattern data necessary for the plurality of types of optical disks using a computer.

3. A method of forming a mask pattern according to claim 2, wherein the basic pattern information is previously recorded in a memory, and the recorded basic pattern information is used in the step of generating a mask pattern to generate the mask pattern.

4. A method of forming a mask pattern according to claim 1, wherein, when the various types of optical disks are formed to record data in the form of pits thereon, the basic pattern information includes a plurality of types of pit patterns.

5. A method of forming a mask pattern according to claim 4, wherein the basic pattern information is parameter information of pit forms.

6. A method of forming a mask pattern according to claim 5, wherein sizes of the pits are corrected for each of the plurality of types of pit patterns in accordance with the formatted data.

7. A method of forming a mask pattern according to claim 5, wherein shifts in a direction of a time axis in the plurality of types of pit patterns are corrected in accordance with the formatted data.

8. A method of forming a mask pattern according to claim 5, wherein slopes of edges of the pits of the plurality of types of pit patterns are controlled in accordance with the formatted data.

9. A device for forming a mask pattern, comprising:
basic pattern information generating means for generating basic pattern information from basic signal pattern data necessary for various types of optical disks;
mask pattern image generating means for generating a mask pattern image by making formatted data obtained by formatting authoring data correspond to the basic pattern information generated by the basic information generating means.

10. A device for forming a mask pattern according to claim 9, further comprising a memory means for recording therein the basic pattern information generated by the basic pattern information generating means, wherein the mask pattern image generating means uses the basic pattern information recorded in the memory means in order to generate the mask pattern image.

11. A device for forming a mask pattern according to claim 9, wherein, when the various types of optical disks are formed to record data in the form of pits thereon, the basic pattern information includes a plurality of types of pit patterns.

12. A device for forming a mask pattern according to claim 11, wherein the basic pattern information is parameter information of pit forms.

13. A device for forming a mask pattern according to claim 12, wherein sizes of the pits are corrected for each of the plurality of types of pit patterns in accordance with the formatted data.

14. A device for forming a mask pattern according to claim 12, wherein shifts in a direction of a time axis in the plurality of types of pit patterns are corrected in accordance with the formatted data.

15. A device for forming a mask pattern according to claim 12, wherein slopes of edges of the pits of the plurality of types of pit patterns are controlled in accordance with the formatted data.

16. A method of producing an optical disk, comprising the steps of:
carrying out a formatting operation for generating formatted data obtained by formatting authoring data; and
generating a mask pattern by making the formatted data obtained from the step of carrying out a formatting operation correspond to basic pattern information obtained from basic signal pattern data necessary for various of types of optical disks;
forming a master mask from the mask pattern generated in the step of generating a mask pattern;
forming a metal-master using the master mask formed in the step of forming a master mask; and
forming a completed optical disk using the metal master formed in the step of forming a metal master.

17. A method of producing an optical disk according to claim 16, wherein, in the step of forming a metal master, the master mask is used to expose an entire disk coated with resist to light as a result of projecting the light thereon, a development operation is performed on a predetermined portion of the exposed disk coated with resist, an electrically conductive film is formed, and an electrotyping operation is carried out while the electrically conductive film serves as an electrode, whereby the metal master is formed.

18. A method of producing an optical disk according to claim 16, wherein, in the step of forming a completed optical disk, the metal master is used to perform injection molding of resin, after which various films are deposited in order to form the completed optical disk.

19. A method of producing an optical disk according to claim 16, wherein, based on an evaluation result of the metal master formed by the step of forming a metal master, the precision with which the mask pattern is formed in the step of forming a mask pattern is controlled in order to optimize a recording parameter.

20. A method of producing an optical disk according to claim 16, wherein, based on an evaluation result of the completed optical disk formed in the step of forming a completed optical disk, the precision with which the mask pattern is formed in the step of forming a mask pattern is controlled in order to optimize a recording parameter.

* * * * *